United States Patent
Agarwal et al.

(10) Patent No.: US 10,049,724 B2
(45) Date of Patent: Aug. 14, 2018

(54) AGING TOLERANT REGISTER FILE

(71) Applicant: Intel Corporation, Santa Clara, CA (US)

(72) Inventors: Amit Agarwal, Hillsboro, OR (US); Steven K. Hsu, Lake Oswego, OR (US); Sri Harsha Choday, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/176,069

(22) Filed: Jun. 7, 2016

(65) Prior Publication Data
US 2017/0352408 A1 Dec. 7, 2017

(51) Int. Cl.
*G11C 11/00* (2006.01)
*G11C 11/419* (2006.01)
*G11C 5/14* (2006.01)

(52) U.S. Cl.
CPC ............ *G11C 11/419* (2013.01); *G11C 5/14* (2013.01)

(58) Field of Classification Search
CPC ..... G11C 11/417; G11C 5/147; G11C 11/419; G11C 5/14; G11C 7/12; G11C 5/148; G11C 7/106; G11C 7/1069; G11C 8/08
See application file for complete search history.

(56) References Cited

U.S. PATENT DOCUMENTS

| | | | | |
|---|---|---|---|---|
| 7,209,395 | B2* | 4/2007 | Hsu | G11C 11/413 365/189.12 |
| 7,606,062 | B2* | 10/2009 | Hsu | G11C 11/419 365/154 |
| 2008/0273412 | A1 | 11/2008 | Lih et al. | |
| 2009/0303819 | A1 | 12/2009 | Park et al. | |
| 2011/0038217 | A1 | 2/2011 | Johnson et al. | |
| 2013/0044556 | A1 | 2/2013 | Upputuri | |
| 2014/0003181 | A1* | 1/2014 | Wang | G11C 11/413 365/226 |
| 2014/0169109 | A1* | 6/2014 | Donkoh | G11C 11/418 365/191 |
| 2015/0279438 | A1 | 10/2015 | Kulkarni et al. | |
| 2017/0011793 | A1* | 1/2017 | Shamanna | G11C 7/22 |

OTHER PUBLICATIONS

International Search Report and Written Opinion from PCT/US2017/028994 dated Jan. 18, 2018, 13 pgs.

* cited by examiner

*Primary Examiner* — Hien Nguyen
(74) *Attorney, Agent, or Firm* — Green, Howard & Mughal LLP

(57) ABSTRACT

An apparatus is provided which comprises: a first supply node to provide power supply; a column of memory cells coupled to the first supply node; a diode-connected device having a gate terminal coupled to the first supply node, and a source terminal coupled to second supply node; and a stack of devices coupled to the first supply node, wherein at least one device in the stack is coupled to the second supply node, and wherein the stack of devices is controllable according to an operation mode.

18 Claims, 12 Drawing Sheets

AGING TOLERANT REGISTER FILE

GOVERNMENT LICENSE RIGHTS

This invention was made with Government support under contract number FA8650-13-3-7338 awarded by the Department of Defense. The Government has certain rights in this invention.

BACKGROUND

Register Files (RF), Read Only Memories (ROMs) and Content Addressable Memories (CAMs) usage is increasing rapidly in modern microprocessor and SoC (System-on-Chip) designs due to their energy efficient local storage/access to feed various compute blocks such as Arithmetic Logic Unit (ALU), accelerators, graphics execution units, etc. Supply voltage scaling, which is an effective knob for improving energy efficiency, is governed by the memory array $V_{MIN}$ or the data path logic $V_{MIN}$. Here, the term "$V_{MIN}$" or "minimum operating voltage" generally refers to the lowest operating voltage level below which the memory will lose its data. Lowering the $V_{MIN}$ for memory (when that $V_{MIN}$ is the limiter) and/or reducing memory dynamic power at ISO-$V_{MIN}$ (when the $V_{MIN}$ of the logic is the limiter) is preferred for improved energy efficiency of the entire design. Addressing aging concerns of memories is also challenging in view of lowering $V_{MIN}$.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
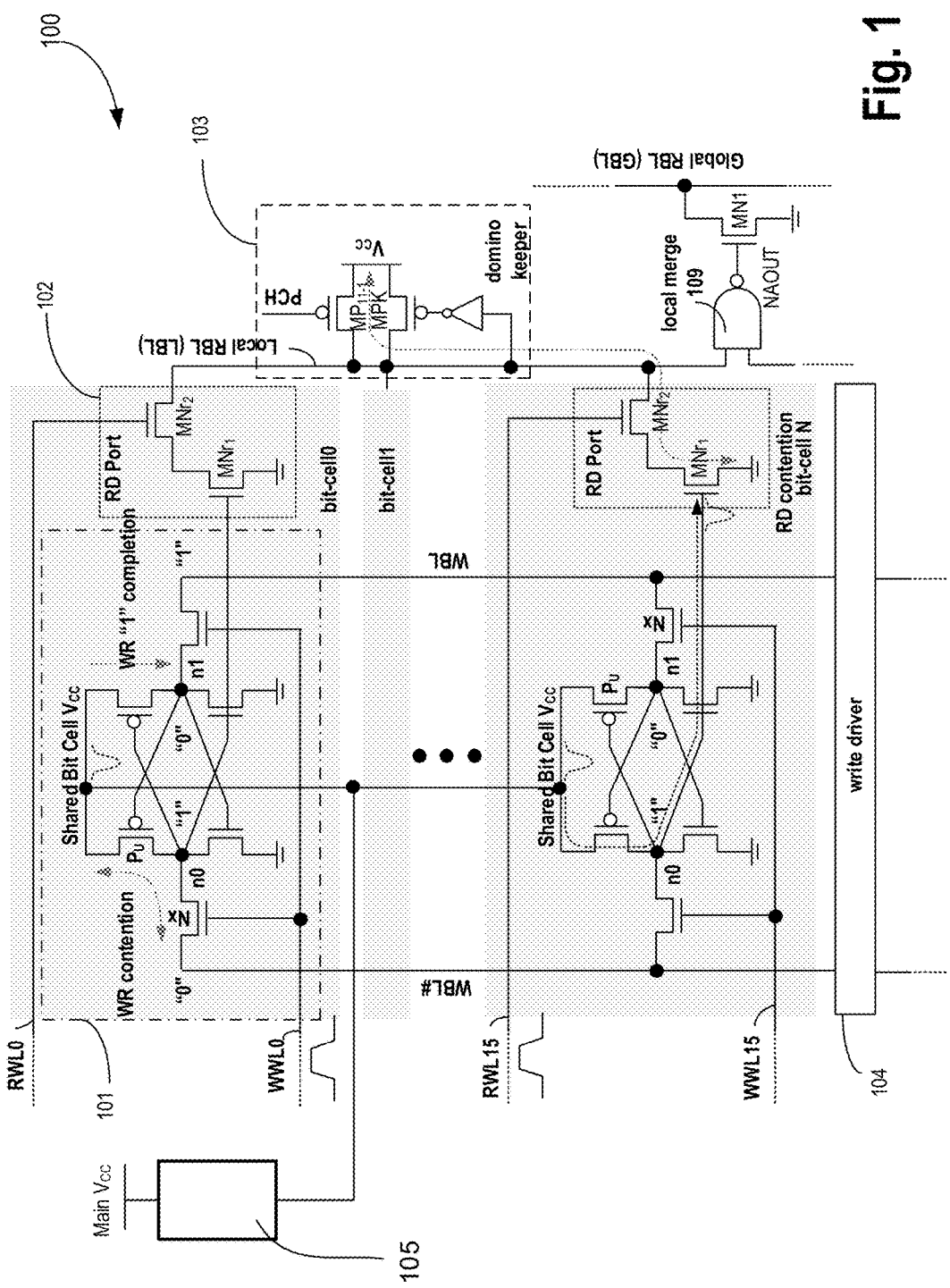
FIG. 1 illustrates a register file (RF) with an n-type read port and controllable shared power supply.

Fine grain power management in today's high-performance multi-core microprocessor scales supply voltage to meet throughput requirement while operating under a tight power envelope. To improve power efficiency or operation per watt while meeting the performance of a single thread, the mode of operation ranges from turbo-mode (e.g., high performance mode) to the processor lowest operating voltage (e.g., low performance mode). The active minimum operating supply voltage ($V_{MIN}$) of a microprocessor core is limited by register files (RFs) read/write circuits across parameter variation, and degrades with technology scaling. Microprocessor core $V_{MIN}$ can be improved by upsizing critical devices or adding a separate higher register file supply voltage. However, these result in prohibitively increased die area, leakage, and design complexity.

Register file circuit techniques like contention-free keeper for read and shared-P (e.g., p-devices coupled to the shared supply node) for write can be used to address the read delay/write contention limited $V_{MIN}$ problem. However, as technology is scaled, the contribution of aging has gotten more and more significant. The use of high performance modes (e.g., turbo-mode) also accelerates the aging degradation due to high voltage stress. The increased aging results in contention-free keeper read circuit $V_{MIN}$ to be read noise limited (due to, for example, p-type keeper aging) and shared-P write circuit to be write completion limited.

Some embodiments describe an aging-tolerant gated-shared-P with a diode-clamp which is coupled to a shared supply node to improve both write contention and completion limited $V_{MIN}$. In some embodiments, the aging tolerant gated-shared-P with diode clamp turns off the shared-P devices when a memory bit-cell is not accessed while clamping the virtual supply (e.g., the shared supply) at lower voltage through the diode. As such, aging impact is reduced. By reducing the impact of aging on the shared-P circuit, both contention and completion during write operation improves under aging/process variation, in accordance with some embodiments.

Some embodiments also describe a fully-gated contention-free bit-line (BL) keeper (or BL keeper with reduced contention) to improve aging limited read noise while reducing contention limited read delay, improving overall read $V_{MIN}$. In some embodiments, the BL keeper with reduced contention delays the keeper activation to reduce read contention. As such, read delay $V_{MIN}$ is improved. The BL keeper with reduced contention of various embodiments also improves noise $V_{MIN}$ while maintaining the read delay $V_{MIN}$ benefit.

There are many technical effects of the various embodiments. For example, the apparatus of some embodiments, improves the write $V_{MIN}$ by, for example, 180 mV and read $V_{MIN}$, for example, by 120 mV compared to conventional register-file design. The apparatus of some embodiments provides a scalable solution to deliver adequate active $V_{MIN}$ as process nodes scale. The apparatus of some embodiments reduces the aging effect which limits the $V_{MIN}$ improvement achieved by previous $V_{MIN}$ circuits. In some embodiments, the keeper operation during read is reduced to decrease contention during read without upsizing the pull-down device(s) while fully-gating the keeper to reduce aging impact to achieve low noise $V_{MIN}$. The write circuit of the various embodiments uses a shared-P circuit to reduce write contention while gating this shared-P. In some embodiments, a diode-clamp is introduced on the power supply node to reduce aging effect during write completion.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back," "top," "bottom," "over," "under," and the like in the description and in the claims, if any, are used for descriptive purposes and not necessarily for describing permanent relative positions.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

FIG. 1 illustrates a register file (RF) 100 with an n-type read port and controllable shared power supply, in accordance with some embodiments. FIG. 1 shows a baseline one read and one write (1R/1W) RF design with hierarchical local and global read BLs utilizing a single-ended large signal read sensing mechanism. RF 100 includes memory cells (e.g., 101) with read ports (e.g., 102), domino keeper 103, write driver 104, gated supply with diode clamp 105, local read bit-line (LBL), local merge logic 109, global read bit-line (GBL), read word-lines (RWLs), write word-lines (WWLs), and write bit-lines (WBLs).

Here, sixteen 8-T (eight transistor) Static Random Access Memory (SRAM) bit cells are shown (e.g., bit-cell 0, bit-cell 1 . . . bit-cell N, where 'N' is an integer) organized in a column (or slice). For example, 'N' can be 7, 15, ad 31. Each bit-cell receives its own RWL and WWL, and shares WBL and its inverse (i.e., WBL#) with other bit-cells in the same column. While the various embodiments here are described with reference to an 8-T SRAM architecture, the embodiments are also applicable to other types of memories such as 4-T, 6-T, SRAMs, Read Only Memories (ROMs) and Content Addressable Memories (CAMs).

Continuing with the example of the 8-T bit-cell, each bit-cell includes a 6-T memory cell 101 and a 2-T read port 102. The 6-T memory cell 101 includes cross-coupled inverters powered by a shared bit-cell $V_{CC}$ (power supply). The power supply to the bit-cells is provided by block 105 which includes one or more gated p-type devices (also referred to as gated Shared-P devices) and a diode clamp, according to some embodiments. One purpose of block 105 is to reduce aging effects (e.g., increase aging tolerance of the bit-cells). In some embodiments, during read or write operation, the gated p-type devices of block 105 are turned on. In some embodiments, when the memory bit-cells are not being accessed, the gated p-type devices of block 105 are turned off.

The cross-coupled inverters of each bit-cell include two p-type transistors and two n-type transistors as shown such that node n0 is input to one inverter and output to the other inverter, and node n1 is input to one inverter and output to the other inverter. The 6-T memory cell includes access devices coupled to nodes n0 and n1, and coupled to WBL and WBL#, respectively. The gate terminals of the access devices (here, n-type devices) are controlled by the WWL. For example, for bit-cell 0, the access devices are controlled by WWL0, for bit-cell 1, the access devices are controlled by WWL1, and so on such that the access devices for bit-cell 15 are controlled by WWL15.

The read port (RD Port) 102 includes two n-type devices $MN_{r1}$ and $MN_{r2}$. N-type transistor $MN_{r1}$ is coupled in series with transistor $MN_{r2}$. The gate terminal of the n-type transistor $MN_{r2}$ is controlled by RWL0, while the gate terminal of transistor $MN_{r1}$ is coupled to a data node (e.g., one of nodes n0 or n1). The output of RD Port 102 is LBL. The charge on LBL is held by domino keeper 103. Each LBL may have its own domino keeper. Domino keeper 103 includes a pre-charge p-type transistor $MP_{11-1}$ which is controlled by a pre-charge signal (PCH).

Domino keeper 103 includes a keeper device (or domino keeper) MPK controlled by an inverter having an input coupled to LBL and an output coupled to the gate terminal of p-type transistor MPK. While FIG. 1 shows one keeper device MPK, in some embodiments, to reduce contention and assist timing there can be one or more p-type transistors such that the gate terminals of the one or more p-type transistors is controlled by an inverter while the other gate terminals of the p-type keeper are controllably turned on after pre-charge operation ends.

In some embodiments, the read port of the multiple bit-cells (e.g., 16, 32, or 64) are evaluated using local read merge NAND gate 109. The outputs of merge NAND gate 109 drive the global BL pulldown devices (e.g., n-type transistor MN1). The global BLs (GBLs) are evaluated using a Set Dominant Latch (SDL) or a regular latch.

Figure 2:
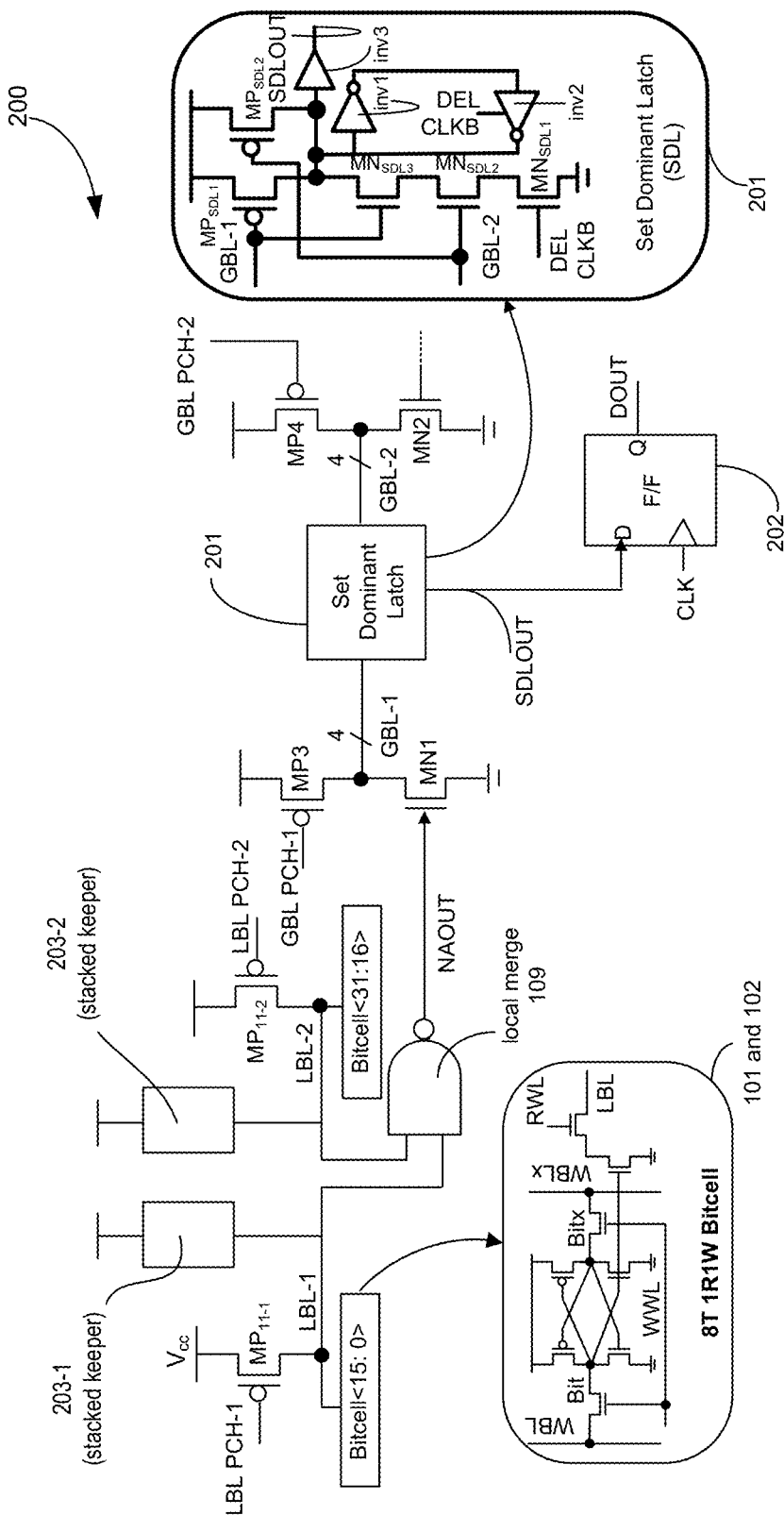
FIG. 2 illustrates the read path of the RF of FIG. 1.

FIG. 2 illustrates read path 200 of the RF of FIG. 1, according to some embodiments of the disclosure. It is pointed out that those elements of FIG. 2 having the same reference numbers (or names) as the elements of any other figure can operate or function in any manner similar to that described, but are not limited to such.

In some embodiments, read path includes SDL 201, Sampler 202, and stacked keeper circuits 203-1 and 203-2. Read path 200 includes a portion of RF 100 and more details of logic after local merge NAND gate 109. LBLs for each column of bit-cells is received by local merge NAND gate 109. For example, LBL-1 associated with the first set of sixteen bit-cells (e.g., Bitcell<15:0>), and LBL-2 associated with the second set of sixteen bit-cells (e.g., Bitcell<31:16>) are received by local merge NAND gate 109 that provides an output NAOUT. Here, stacked keeper 203-1 is coupled to LBL-1, while stacked keeper 203-2 is coupled LBL-2.

As described with reference to FIG. 1, any number or group of bit-cells may be used. For example, 8, 16, or 32 bit-cells per LBL can be used. Each LBL has a pre-charge controlled device. Here, p-type pre-charge device $MP_{11-1}$ is coupled to LBL-1 and controlled by LBL PCH-1, and p-type pre-charge device $MP_{11-2}$ is coupled to LBL-2 and controlled by LBL PCH-2.

The output NAOUT controls the pull-down device MN1 which pull-downs GBL-1 (which may be a multi-bit bus (e.g., 4 bits)). For example, GBL-1 may refer to node GBL-1 or signal GBL-1 depending on the context of the sentence. In some embodiments, a p-type device MP3 is coupled in series with the pull-down transistor MN1, where transistor MP3 is controlled by a first pre-charge GBL signal GBL PCH-1. SDL 201 latches signals on GBLs that provides an output SDL OUT. Here, signal names and nodes names are interchangeably used. For example, a second GBL-2 from another bank of memory cells is also received by SDL 201.

Here, GBL-2 is provided by the series output transistors MP4 and MN2, where the p-type transistor MP4 is controlled by pre-charge GBL signal GBL PCH-2. One embodiment of SDL 201 is illustrated in FIG. 2. SDL 201 comprises transistors $MN_{SDL1}$, $MN_{SDL2}$, $MN_{SDL3}$, $MP_{SDL1}$, and $MP_{SDL2}$, inverter inv1, clock enabled inverter inv2 (enabled by delayed clock DEL CLKB, which is an inverse of CLK), and buffer inv3 coupled together as shown. The gates of transistors $MP_{SDL1}$ and $MN_{SDL3}$ are controlled by GBL-1. The gates of transistors $MN_{SDL2}$ and $MP_{SDL2}$ are controlled by GBL-2. The gate of transistor $MN_{SDL1}$ is controlled by DEL CLKB. The output of SDL 201 is SDLOUT which is then sampled by flip-flop 202 to provide output data DOUT.

Figure 3:
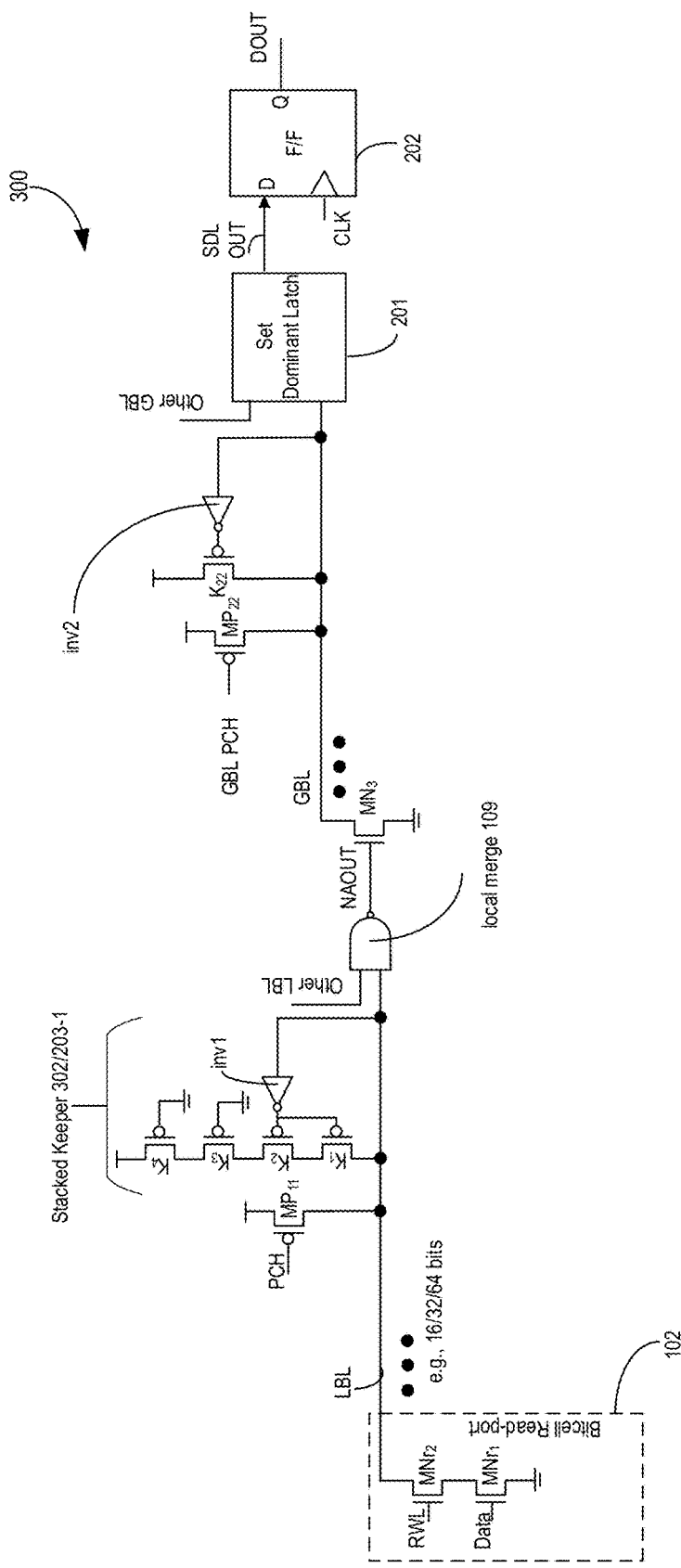
FIG. 3 illustrates an apparatus showing a read Bit-Line (BL) sensing scheme, according to some embodiments of the disclosure.

FIG. 3 illustrates apparatus 300 showing a read BL sensing scheme, according to some embodiments of the disclosure. It is pointed out that those elements of FIG. 3 having the same reference numbers (or names) as the elements of any other figure can operate or function in any manner similar to that described, but are not limited to such.

In some embodiments, LBL is merged with other LBLs (from other read paths) by local merge NAND gate 109. In some embodiments, the LBL node is coupled to the bit-cell read ports 102. In some embodiments, apparatus 300 comprises Stacked Keeper 302 which is coupled to the LBL node. In some embodiments, Stacked Keeper 302 comprises p-type transistors $K_1$, $K_2$, $K_3$, and $K_4$ coupled together in series. While Stacked Keeper 302 is described having four stacked p-type transistors, fewer or more p-type transistors may be used for forming Stacked Keeper 302. In some embodiments, the gate terminals of p-type transistors $K_3$ and $K_4$ are coupled to ground (i.e., configured to be turned on). In some embodiments, the gate terminals of p-type transistors $K_3$ and $K_4$ are controlled by a signal which causes p-type transistors $K_3$ and $K_4$ to turn on after some delay and after precharge operation ends (e.g., after PCH asserts to $V_{CC}$ level).

The various embodiments are described with reference to reducing aging effects of p-type devices (which generally age faster than n-type devices). However, in some process nodes, n-type devices may age faster than p-type devices. The schemes of various embodiments can be flipped to reduce aging effects of such fast aging n-type devices.

In some embodiments, the gate terminals of p-type transistors $K_1$ and $K_2$ are controlled by an output of an inverter which inverts the signal on the LBL node. As such, when the voltage on the LBL is higher than the switching threshold of the inverter inv1, the voltage on node LBL is pulled to $V_{CC}$ by Stacked Keeper 302.

In some embodiments, the inverter inv1 coupled to the p-type transistor $K_2$ is enabled by the pre-charge signal (PCH) via n-type transistor $MN_2$. In some embodiments, apparatus 300 comprises p-type transistor $MP_{11}$ which is controlled by PCH. In some embodiments, when PCH is low, LBL is pulled to $V_{CC}$ by the p-type transistor $MP_{11}$ while Stacked Keeper 302 is disabled by transistor $MN_2$.

As discussed with reference to FIG. 2, the output of the local merge NAND gate 109 is NAOUT which is received by the pull-down n-type transistor $MN_3$. The transistor $MN_3$ is coupled to the GBL. In some embodiments, GBL is precharged by p-type transistor $MP_{22}$ which is controlled by the GBL PCH.

In some embodiments, the keeper is like Stacked Keeper 302 but for keeping the charge on the GBL node. In some embodiments, the keeper comprises a p-type device $K_{22}$ which is controlled by inverter inv2 that receives GBL as input. As such, when the voltage on the GBL is higher than the switching threshold of the inverter inv2, the voltage on node GBL is pulled to $V_{CC}$ by the keeper device $K_{22}$. In some embodiments, the inverter coupled to the p-type transistor $K_{22}$ is enabled by GBL PCH via n-type transistor MN$_5$. As discussed with reference to FIG. 2, the GLB is received as input by SDL 201.

The read local bit-line (LBL or RLBL) of FIG. 3 is designed using high fan-in wide-domino OR circuits to achieve single-cycle read latency and throughput. Due to the wide-domino OR gates, this RLBL is susceptible to various noise sources such as DC read word-line (RWL) voltage offset, charge sharing, interconnect coupling, and RWL propagated noise, requiring strong keepers to prevent false evaluations (e.g., during read '0' operation). However, this worsens the contention between the p-type keeper 302/203-1 and p-type pull-down of read port 102 during evaluation (e.g., reading '1') resulting in read delay push-out. The conventional keeper stack becomes weak under worst case aging stress during high supply operation.

The p-type keeper devices which are permanently tied to ground (e.g., transistors K$_3$ and K$_4$ of stacked keeper 302) are generally designed using minimum sized transistors and are 100% time stressed, resulting in considerable aging variation. Stacked keeper 302/203-1 driven by inverter inv1 (e.g., transistors K$_1$ and K$_2$ of stacked keeper 302) is also on during precharge, and in worst case can be under significant aging stress. The weakening of Stacked keeper 302/203-1 under aging results in noise V$_{MIN}$ failure. The read delay is still limited by a strong non-aged keeper under worst case delay V$_{MIN}$ condition.

With increase in aging of the read path of FIG. 3 and memory bit-cell 101 (which are designed to reduce read/write contention under variation), traditional RFs have become read noisy (e.g., due to Stacked keeper 302/203-1 aging) or read noise limited, and write completion limited. For example, adding a shared-p circuit to the shared power supply V$_{CC}$ may improve the write V$_{MIN}$ contention by limiting the pull-up strength, however, the RF becomes write completion limited due to weakening of the p-type devices (which worsens with aging). To solve one or more of these problems, an aging tolerant RF is described with reference to FIGS. 4-5 and FIGS. 8-9, according to some embodiments.

Figure 4A:
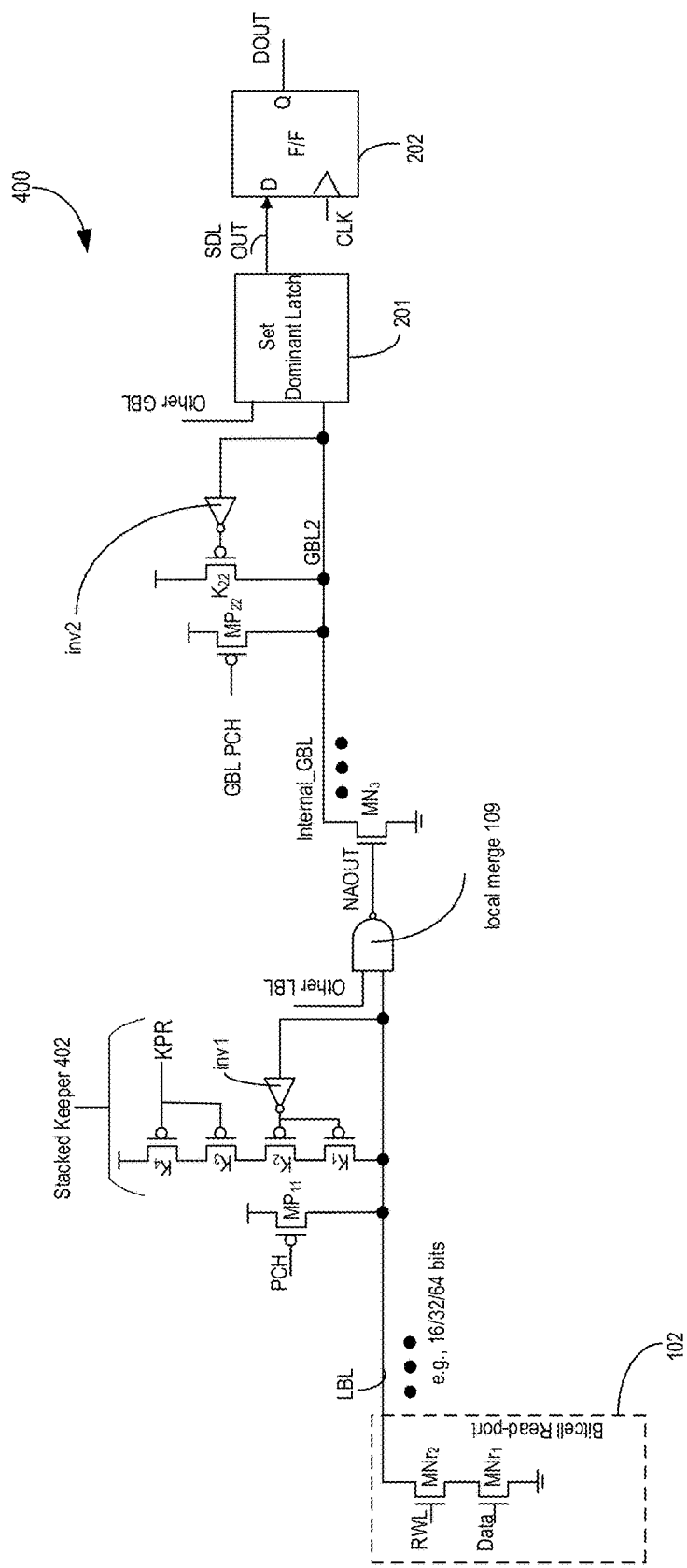
FIG. 4A illustrates a read BL sensing scheme with aging resistant keeper, according to some embodiments of the disclosure.

FIG. 4A illustrates read BL sensing scheme 400 with aging resistant keeper, according to some embodiments of the disclosure. It is pointed out that those elements of FIG. 4A having the same reference numbers (or names) as the elements of any other figure can operate or function in any manner similar to that described, but are not limited to such. So as not to obscure the embodiments, differences between FIG. 3 and FIG. 4A are described.

In some embodiments, aging resistant keeper 402 is delay controlled compared to keeper 302 of FIG. 3. In some embodiments, the p-type keeper devices K$_3$ and K$_4$ which were tied to ground in FIG. 3, are now controlled by a control signal KPR. In some embodiments, KPR is generated by a logic (not shown) that monitors the precharge signal PCH and generates the KPR signal according to whether PCH is asserted or de-asserted. In some embodiments, the p-type keeper devices K$_3$ and K$_4$ are activated (i.e., turned on) with some delay relative to PCH. As such, in some embodiment, aging resistant keeper 402 delays the activation of its keeper function during evaluation to reduce keeper contention and thus improving read delay V$_{MIN}$.

During keeper delay, the LBL is floating and is susceptible to noise (during read '0'). However, after keeper delay, the strong keeper activates and recovers the noise droop. The keeper transistors connected to the KPR signal are gated during precharge and hence have lower impact of aging, in accordance with some embodiments. However, the keeper p-type devices K$_1$ and K$_2$ driven by inverter inv1 are on during precharge, and in worst case are under significant aging stress. The floating period during keeper delay and partial weakening of keeper results in contention-free keeper V$_{MIN}$ to be read noise limited, in accordance with some embodiments.

Figure 4B:
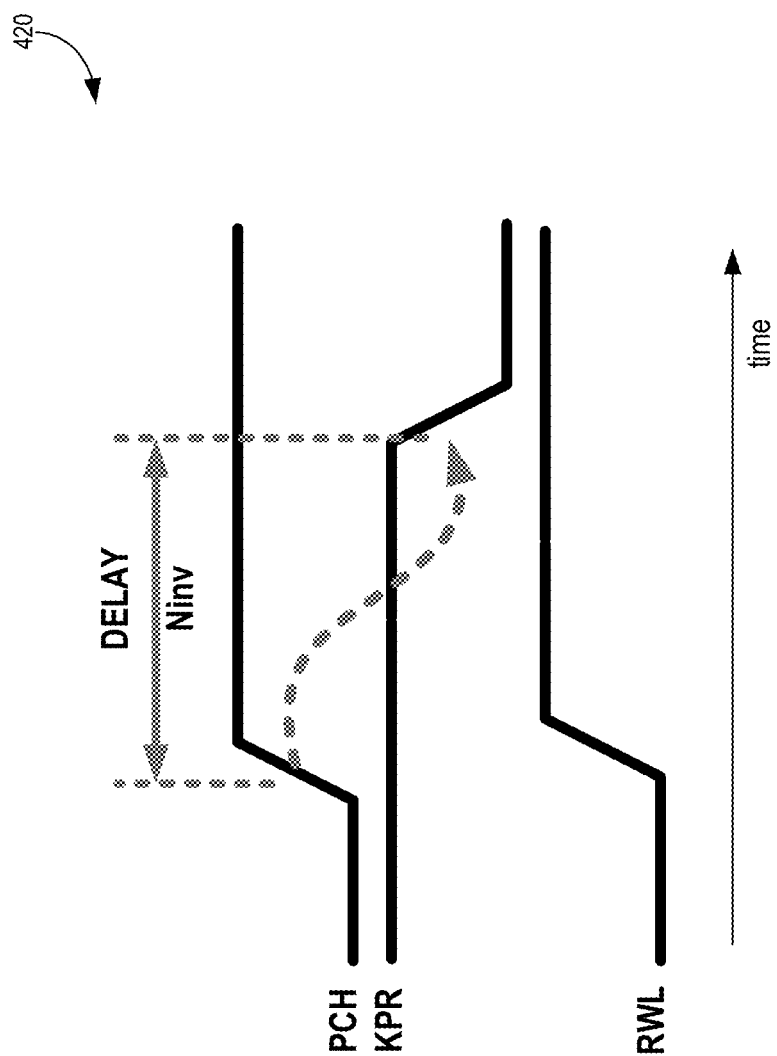
FIG. 4B illustrates a plot showing timing diagram of the aging resistant keeper of FIG. 4A, according to some embodiments of the disclosure.

FIG. 4B illustrates plot 420 showing timing diagram of the aging resistance keeper of FIG. 4A, according to some embodiments of the disclosure. It is pointed out that those elements of FIG. 4B having the same reference numbers (or names) as the elements of any other figure can operate or function in any manner similar to that described, but are not limited to such. Here, x-axis is time and y-axis is voltage for each waveform. In some embodiments, logic is provided which delays the de-assertion of KPR signal after a delay from the time PCH signal asserts.

Figure 5A:
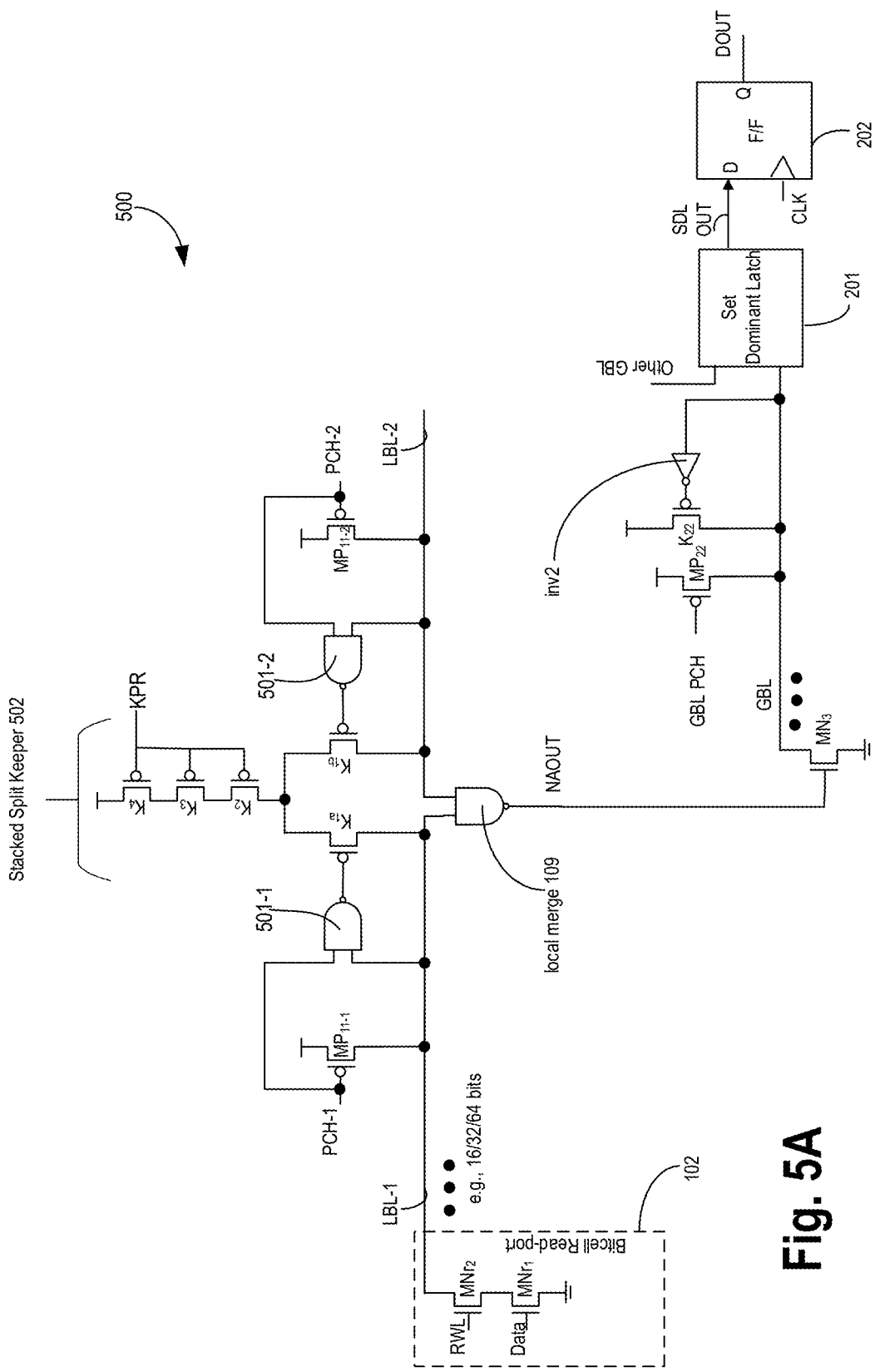
FIG. 5A illustrates a read BL sensing scheme with a shared keeper stack split across two local BLs (LBLs) to provide aging tolerance, according to some embodiments of the disclosure.

FIG. 5A illustrates read BL sensing scheme 500 with shared keeper stack split across two local BLs (LBLs) to provide aging tolerance, according to some embodiments of the disclosure. It is pointed out that those elements of FIG. 5A having the same reference numbers (or names) as the elements of any other figure can operate or function in any manner similar to that described, but are not limited to such.

In some embodiments, read BL sensing scheme 500 comprises precharge transistor MP$_{11-1}$ coupled to LBL-1, NAND gate 501-1, stacked split keeper 502, NAND gate 501-2, and precharge transistor MPH-2 coupled to LBL-2. In some embodiments, stacked split keeper 502 comprises stack of devices K$_2$, K$_3$, and K$_4$ which are controllable by KRP, and split devices K$_{1a}$ coupled to LBL-1 and K$_{1b}$ coupled to LBL-2.

Read BL sensing scheme 500 replaces LBL inverter inv1 of FIGS. 3-4 (connected to the keeper) to a NAND gate which is gated through precharge signal (PCH), in accordance with some embodiments. In some embodiments, the output of the NAND gates turns off the bottom keeper transistors during precharge reducing aging impact on keeper. For example, when PCH-1 turns on MP$_{11-1}$, NAND 501-1 turns off transistor K$_{1a}$, and when PCH-1 turns on MP$_{11-2}$, NAND 501-2 turns off transistor K$_{1b}$.

In some embodiments, delayed KPR signal gates the top keeper stack (e.g., devices K$_2$, K$_3$, and K$_4$) during precharge. As such, aging impact on the min-sized transistors is reduced. In some embodiments, stacked split keeper 502 is shared across the two read local bit-lines (LBL-1 and LBL-2) reducing the area impact of additional added circuit for aging tolerance. In some embodiments, stacked split keeper 502 also reduces the load on KPR signal (e.g., by 50% compared to a design having stacked keepers that are not shared across two read local bit-lines).

In some embodiments, during evaluation, the un-accessed local bit-line remains in precharge, keeping its bottom keeper transistor to be OFF. For example, when LBL-2 is un-accessed, the bottom transistor K$_{1b}$ of stacked split keeper 502 is turned off. As such, shared keeper stack 502 prevents false evaluations of one read local bit-line, in accordance with some embodiments. In some embodiments, delaying the activation of stacked split keeper 502 via KPR signal during evaluation reduces keeper contention and improves read delay V$_{MIN}$. In some embodiments, by fully gating stacked split keeper 502 during precharge operation reduces aging effect on stacked split keeper 502. As such, noise induced false evaluation of data is prevented resulting in improved read noise V$_{MIN}$, in accordance with some embodiments.

Figure 5B:
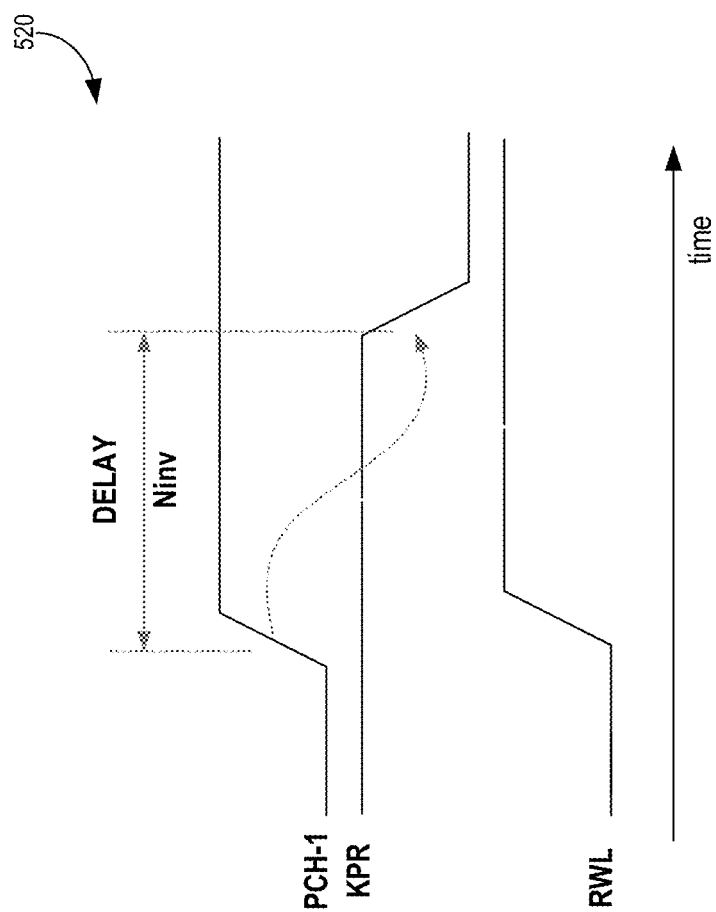
FIG. 5B illustrates a plot showing timing diagram of the aging resistant keeper of FIG. 5A, according to some embodiments of the disclosure.

FIG. 5B illustrates plot 520 showing timing diagram of the aging resistant keeper of FIG. 5A, according to some embodiments of the disclosure. It is pointed out that those elements of FIG. 5B having the same reference numbers (or names) as the elements of any other figure can operate or function in any manner similar to that described, but are not limited to such. Here, x-axis is time and y-axis is voltage for each waveform. In some embodiments, logic is provided which delays de-assertion of KPR signal after a delay from the time PCH signal asserts.

Figure 6:
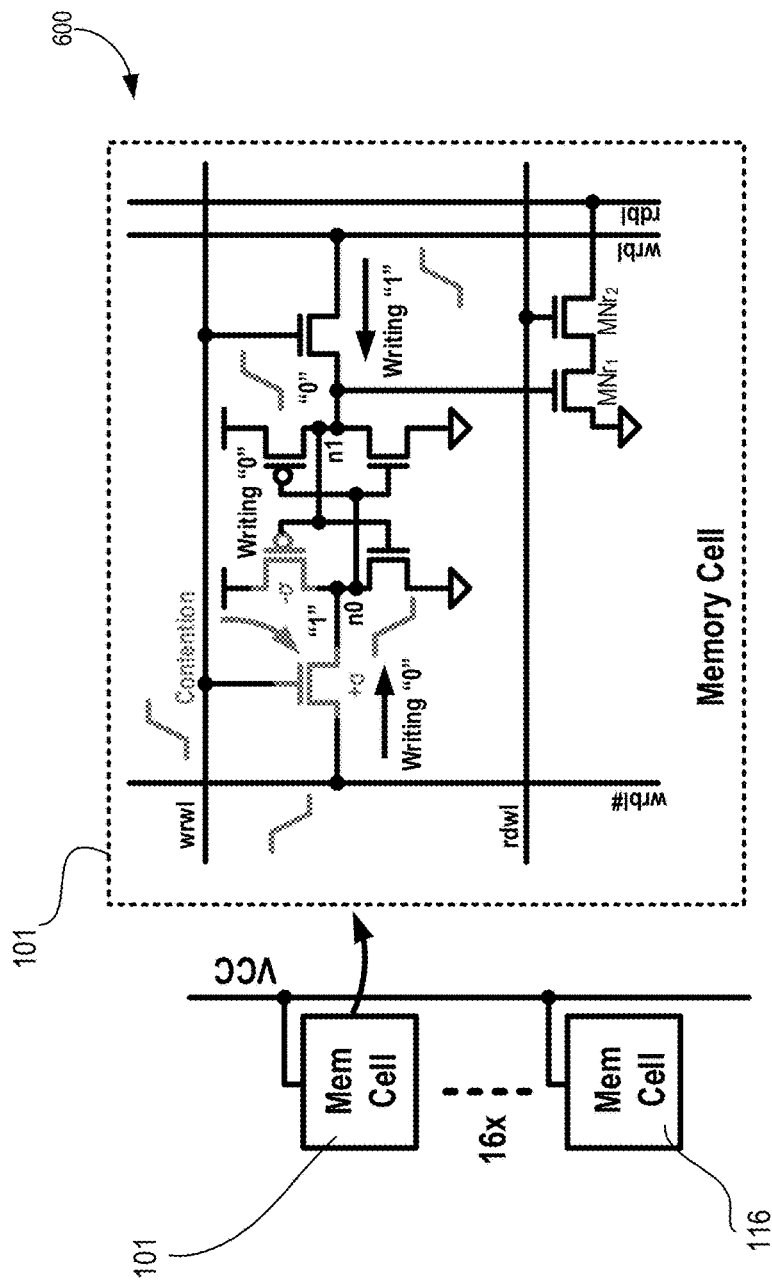
FIG. 6 illustrates a memory cell with write contention.

FIG. 6 illustrates memory 600 with write contention. Here, one column of memory cells 101-116 (e.g., 16 cells) is shown which shares the same supply. A detailed version of memory cell 101 is illustrated as an 8T SRAM (Static Random Access Memory) cell. Memory cell 101 as arranged in memory 600 suffers from write contention under process variations at low supply voltage. The write contention occurs when an access transistor is turned on and is trying to write a '0' onto node n0 while the p-type transistor coupled to node n0 is pulling up that node to Vcc. The contention is illustrated by the grayed out transistors.

Figure 7:
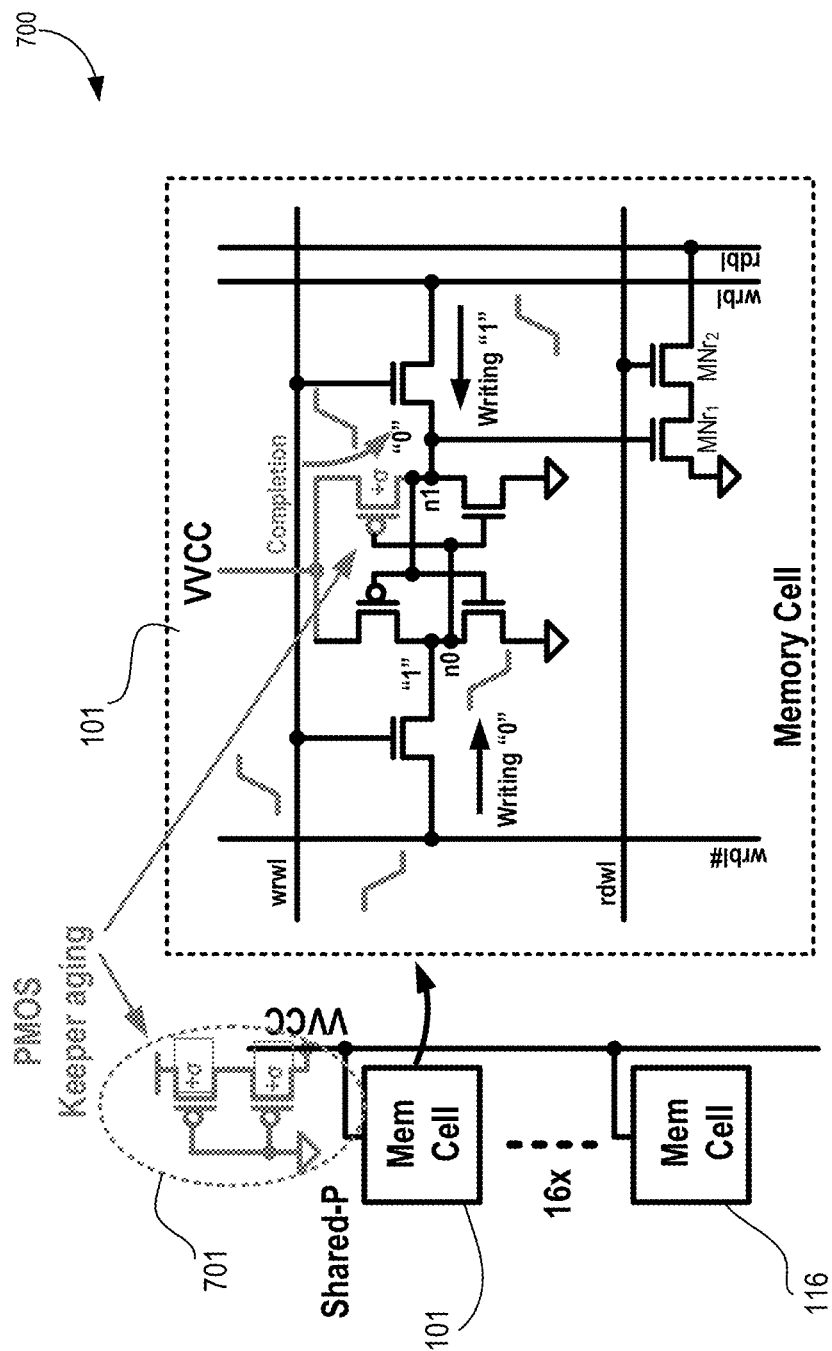
FIG. 7 illustrates a memory column with a shared supply node, and stacked always-on p-type devices coupled to the shared supply node.

FIG. 7 illustrates memory column 700 with a shared supply node, and stacked always-on p-type devices coupled to the shared supply node. It is pointed out that those elements of FIG. 7 having the same reference numbers (or names) as the elements of any other figure can operate or function in any manner similar to that described, but are not limited to such.

In this example, a stack 701 of shared-P devices are coupled to VVCC node (e.g., the shared supply node to the column of memory cells 101-116). Here, VVCC is also referred to as the virtual supply node. The devices in stack 701 are always turned on. For example, the gate terminals of the p-type devices are connected to ground. The stacked p-type devices of stack 701 limit the pull-up strength of the memory cells under variation. As such, contention induced write failure at lower supply voltages is reduced and write $V_{MIN}$ is improved.

However, these always-ON stacked p-type devices of stack 701 are continuously under worst case aging stress and become weak overtime. Also the p-type devices inside memory cell (e.g., cell 101 of memory column 700) can also become weak due to aging stress. This aging stress is more significant during high supply operation (e.g., turbo mode or high performance mode). The reduction in the pull-up strength of memory cell results in write delay push-out making the write $V_{MIN}$ of this design to be write completion limited.

Figure 8A:
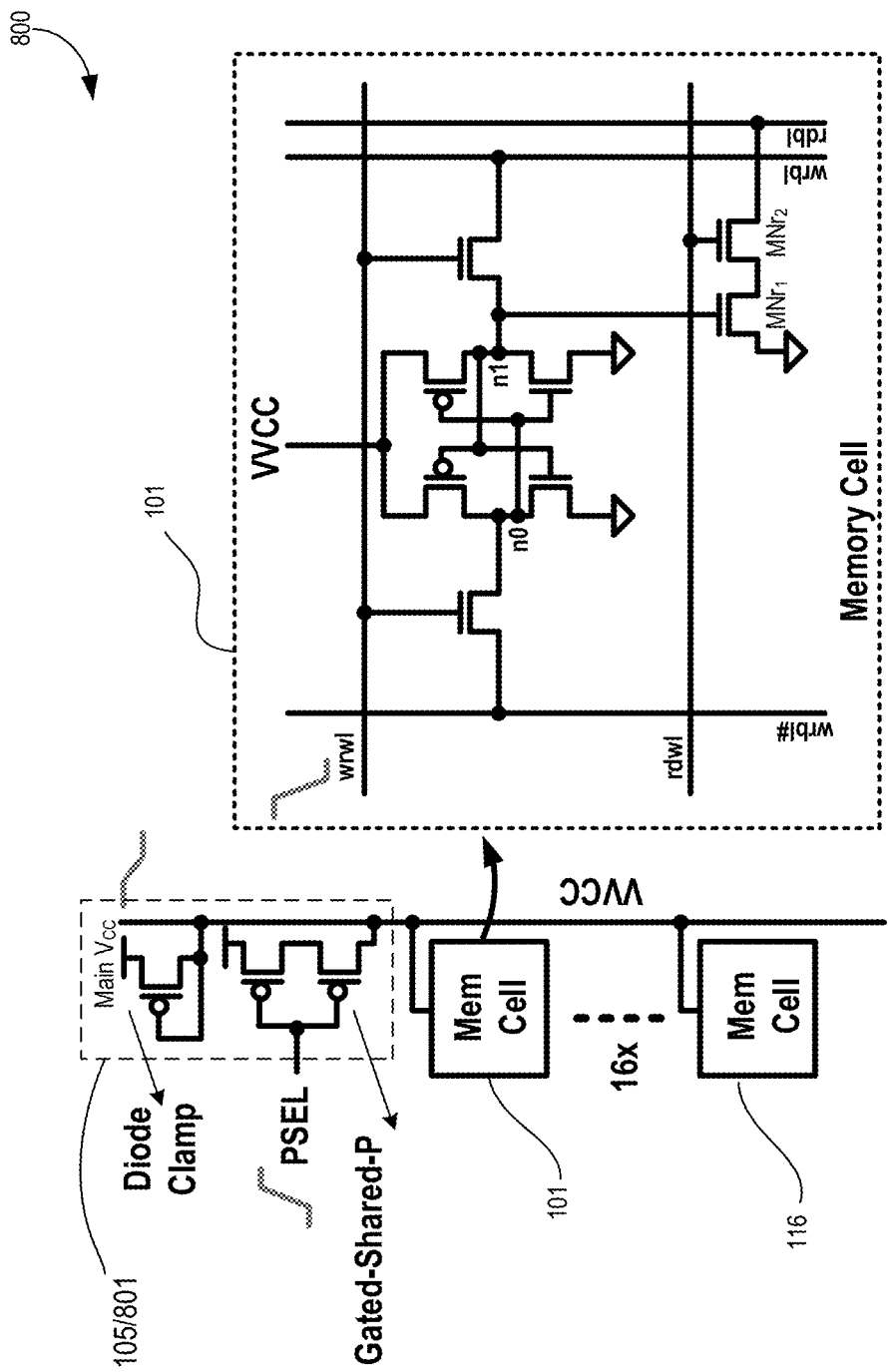
FIG. 8A illustrates a memory column with a shared supply node, and gated stacked p-type devices with a diode clamp coupled to the shared supply node, according to some embodiments of the disclosure.

FIG. 8A illustrates memory column 800 with a shared supply node, and gated stacked p-type devices with diode clamp coupled to the shared supply node, according to some embodiments of the disclosure. It is pointed out that those elements of FIG. 8A having the same reference numbers (or names) as the elements of any other figure can operate or function in any manner similar to that described, but are not limited to such.

In this example, a stack 105/801 of shared-P devices are coupled to VVCC node (i.e., the shared supply node to the column of memory cells 101-116). In some embodiments, stack 801 comprises gated shared-P devices (Gated-Shared-P) which are controllable by PSEL signal, and diode clamp.

Compared to FIG. 7, here instead of connecting shared-P stack 701 to the ground, the shared-P devices are gated by PSEL signal which is derived from a read/write block enable. In some embodiments, when a memory block (e.g., memory 101 of memory column 800) is not accessed PSEL signal turns off the gated stack resulting in reduced effect of aging on the PMOS stack. In some embodiments, during the time shared-P stack is gated, the virtual supply (VVCC) is clamped to a ΔV lower supply voltage via a p-type diode-clamp.

Shared-P stack 701 prevents virtual supply to float and memory cells to lose their data, in accordance with some embodiments. Since virtual supply is clamped at lower voltage than VCC, this reduces the aging stress on the p-type devices internal to the memory cells of memory column 800, in accordance with some embodiments. This technique reduces the aging stress significantly when memory is running at high supply voltage (worst case aging condition, e.g. turbo mode, or high performance mode).

In some embodiments, during read/write operations, PSEL turns on the gated shared-P stack pulling the virtual supply back to VCC (Main Vcc level) for normal operation. Shared-P stack 801 improves the contention limited write $V_{MIN}$, in accordance with some embodiments. In some embodiments, gating the shared-P device with diode clamp also reduces the aging effect on the pull-up strength of the memory cell of column 800, improving completion limited write $V_{MIN}$.

Various embodiments allow memory to function at low supply voltages while maintaining and preventing the read and write paths in the memories from becoming the critical paths. This helps multi-core microprocessors to improve power efficiency by operating at low supply voltages while achieving highest performance at high supply voltages. The embodiments described here also scale well over process nodes.

Figure 8B:
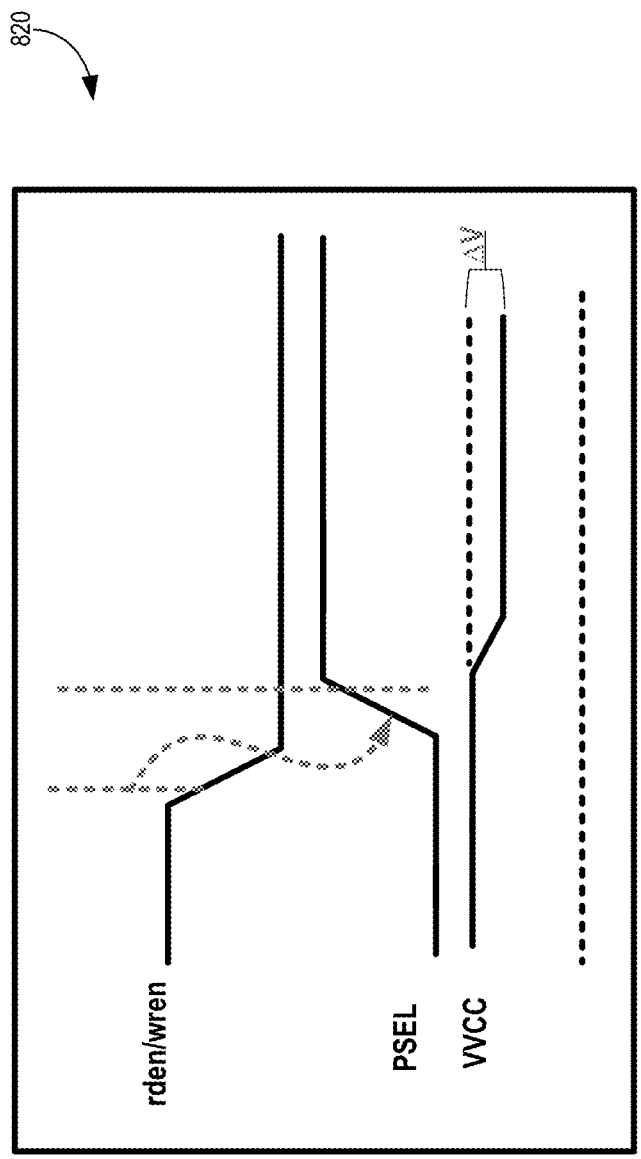
FIG. 8B illustrates a plot showing operation of the memory of FIG. 8A, according to some embodiments of the disclosure.

FIG. 8B illustrates plot 820 showing operation of the memory of FIG. 8A, according to some embodiments of the disclosure. It is pointed out that those elements of FIG. 8B having the same reference numbers (or names) as the elements of any other figure can operate or function in any manner similar to that described, but are not limited to such. Here, x-axis is time and y-axis is voltage for each waveform. In some embodiments, logic is provided which generates PSEL signal after read enable (rden) and write enable (wren) de-asserted. As such, the p-devices of stack 801 are turned on when the memory cell is being written to or read from, and turned off otherwise, in accordance with some embodiments. In some embodiments, when Main Vcc is at low level (e.g., during a low power mode such as sleep mode), PSEL causes the transistors of stack 801 to be turned on.

Figure 9:
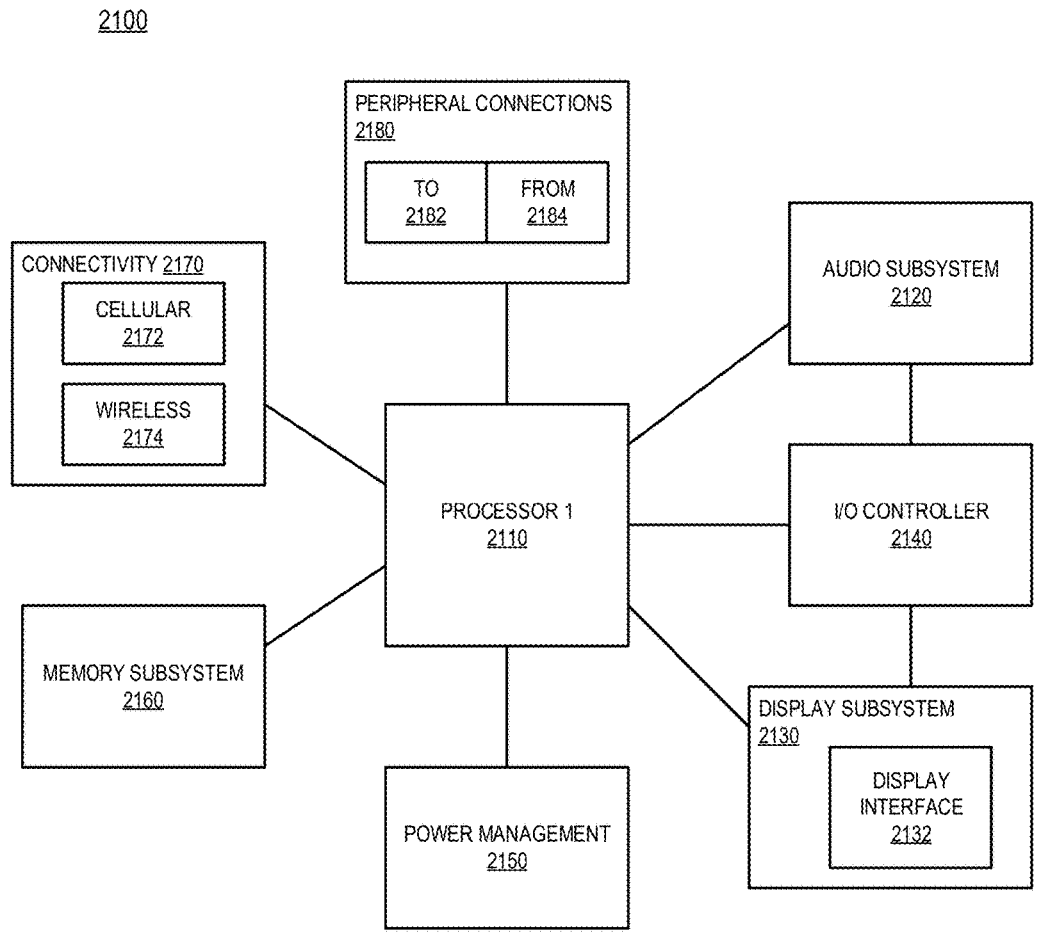
FIG. 9 illustrates a smart device or a computer system or a SoC (System-on-Chip) with aging tolerant RF, in accordance with some embodiments.

FIG. 9 illustrates a smart device or a computer system or a SoC (System-on-Chip) 2100 with aging tolerant RF, in accordance with some embodiments. It is pointed out that those elements of FIG. 9 having the same reference numbers (or names) as the elements of any other figure can operate or function in any manner similar to that described, but are not limited to such.

FIG. 9 illustrates a block diagram of an embodiment of a mobile device in which flat surface interface connectors could be used. In some embodiments, computing device 2100 represents a mobile computing device, such as a computing tablet, a mobile phone or smart-phone, a wireless-enabled e-reader, or other wireless mobile device. It will be understood that certain components are shown generally, and not all components of such a device are shown in computing device 2100.

In some embodiments, computing device 2100 includes a first processor 2110 having an aging tolerant RF, according to some embodiments discussed. Other blocks of the computing device 2100 may also include an aging tolerant RF according to some embodiments. The various embodiments of the present disclosure may also comprise a network interface within 2170 such as a wireless interface so that a system embodiment may be incorporated into a wireless device, for example, cell phone or personal digital assistant.

In one embodiment, processor 2110 (and/or processor 2190) can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O (input/output) with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100.

Elements of embodiments are also provided as a machine-readable medium (e.g., memory 2160) for storing the computer-executable instructions (e.g., instructions to implement any other processes discussed herein). The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 2180 include hardware interfaces and connectors, as well as software components (e.g., drivers, protocol stacks) to make peripheral connections. It will be understood that the computing device 2100 could both be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided which comprises: a first supply node to provide a power supply; a column of memory cells coupled to the first supply node; a diode-connected device having a gate terminal coupled to the first supply node, and a source terminal coupled to a second supply node; and a stack of devices coupled to the first supply node, wherein at least one device in the stack is coupled to the second supply node, and wherein the stack of devices is controllable according to an operation mode.

In some embodiments, the stack of devices are to be turned on when a memory cell in the column of memory cells is being read from or written to. In some embodiments, the stack of devices are to be turned off when none of the memory cells in the column of memory cells is being read from or written to. In some embodiments, the stack of devices are to be turned on during a low power mode operation. In some embodiments, the operation mode is one of: low power mode, high power mode, read mode, or write mode. In some embodiments, the memory cells are SRAM bit-cells.

In some embodiments, the memory cells are part of a register file. In some embodiments, the register file comprises: a bit-line (BL) read port; a first local bit-line (LBL) coupled to the BL read port; a second LBL; and a NAND or a NOR gate coupled to the first and second LBLs such that the first and second LBLs are physically disconnected from one another. In some embodiments, the register file comprises a split-keeper which is operable to be turned off during precharge, the split-keeper having a first part and a second part, wherein the first part of the split-keeper is coupled to the first LBL and the second part of the split-keeper is coupled to the second LBL.

In some embodiments, the register file comprises a first NAND gate which is controllable by a first pre-charge node, and coupled to the first LBL. In some embodiments, the register file comprises a second NAND gate which is controllable by a second pre-charge node, and coupled to the second LBL. In some embodiments, an output of the first NAND gate is to control the first part of the split-keeper, and wherein an output of the second NAND gate is to control the second part of the split-keeper. In some embodiments, the register file comprises: a first pre-charge transistor coupled to the first LBL and to the first pre-charge node; and a second pre-charge transistor coupled to the second LBL and to the second pre-charge node. In some embodiments, the split-keeper includes a stack of devices which is operable to turn on after a delay and after a read operation begins. In some embodiments, the stack of device comprises p-type devices.

In another example, a system is provided which comprises: a memory; a processor coupled to the memory, the memory including an apparatus according to the apparatus described above; and a wireless interface for allowing the processor to communicate with another device.

In another example, an apparatus is provided which comprises: a first read local bit line (RLBL); a read word line (RWL) coupled to a gate of a read transistor, wherein the read transistor is coupled in series with a pull-down transistor and the first RLBL, and wherein the pull-down transistor is coupled to a memory cell; a second RLBL; a first pre-charge transistor coupled to the first RLBL; a second pre-charge transistor coupled to the second RLBL; a split-keeper operable to be turned off during precharge, the split-keeper having a first part and a second part, wherein the first part of the split-keeper is coupled to the first RLBL and the second part of the split-keeper is coupled to the second RLBL.

In some embodiments, the split-keeper comprises: a stack of devices which is operable to turn on after a delay and after a read operation begins; a first device coupled in series with the stack of devices, wherein the first device is controllable by a voltage level of the first RLBL and a first pre-charge, wherein the first device is coupled to the first RLBL; and a second device coupled in series with the stack of devices, wherein the second device is controllable by a voltage level of the second RLBL and a second pre-charge, wherein the second device is coupled to the second RLBL. In some embodiments, the apparatus comprises a NAND gate coupled to the first and second RLBLs.

In some embodiments, the apparatus comprises: a first NAND gate coupled to the first RLBL and is to receive the first pre-charge, the first NAND gate having an output coupled to a gate terminal of the first device, wherein the first pre-charge transistor is to receive the first pre-charge. In some embodiments, the apparatus comprises a second NAND gate coupled to the second RLBL and is to receive the second pre-charge, the second NAND gate having an output coupled to a gate terminal of the second device, wherein the second pre-charge transistor is to receive the second pre-charge.

In another example, a system is provided which comprises: a memory; a processor coupled to the memory, the memory including an apparatus according to the apparatus described above; and a wireless interface for allowing the processor to communicate with another device.

In another example, a method is provided which comprises: turning on, a stack of devices, when a memory cell in a column of memory cells is being read from or written to, wherein the stack of devices is coupled to a first supply node, wherein at least one device in the stack is coupled to a second supply node. In some embodiments, the method comprises turning off, the stack of devices, when none of the memory cells in the column of memory cells is being read from or written to. In some embodiments, the method comprises turning on, the stack of devices, during a low power mode operation. In some embodiments, the method comprises turning off a split-keeper during precharge, wherein the split-keeper has a first part and a second part, wherein the first part of the split-keeper is coupled to a first LBL and the second part of the split-keeper is coupled to a second LBL. In some embodiments, the method comprises: controlling the turn on/off behavior of the first part via a first NAND; and controlling the turn on/off behavior of the second part via a second NAND. In some embodiments, the method comprises: turning on a stack of devices of the split-keeper after a delay and after a read operation begins.

In another example, an apparatus is provided which comprises: means for turning on, a stack of devices, when a memory cell in a column of memory cells is being read from or written to, wherein the stack of devices is coupled to a first supply node, wherein at least one device in the stack is coupled to a second supply node. In some embodiments, the apparatus comprises: means for turning off, the stack of devices, when none of the memory cells in the column of memory cells is being read from or written to. In some embodiments, the apparatus comprises: means for turning on, the stack of devices, during a low power mode operation.

In some embodiments, the apparatus comprises means for turning off a split-keeper during precharge, wherein the split-keeper has a first part and a second part, wherein the first part of the split-keeper is coupled to a first LBL and the second part of the split-keeper is coupled to a second LBL. In some embodiments, the apparatus comprises: first means for controlling the turn on/off behavior of the first part; and second means for controlling the turn on/off behavior of the second part. In some embodiments, the apparatus comprises: means for turning on a stack of devices of the split-keeper after a delay and after a read operation begins.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
    a first supply node to provide a power supply;
    a column of memory cells coupled to the first supply node;
    a diode-connected device having a gate terminal connected to the first supply node, and a source terminal coupled to a second supply node; and
    a stack of devices coupled to the first supply node, wherein at least one device in the stack is coupled to the second supply node, and wherein the stack of devices is controllable according to an operation mode.

2. The apparatus of claim 1, wherein the stack of devices are to be turned on when a memory cell in the column of memory cells is being read from or written to.

3. The apparatus of claim 1, wherein the stack of devices is to be turned off when none of the memory cells in the column of memory cells is being read from or written to.

4. The apparatus of claim 1, wherein the stack of devices is to be turned on during a low power mode operation.

5. The apparatus of claim 1, wherein the operation mode is one of: low power mode, high power mode, read mode, or write mode.

6. The apparatus of claim 1, wherein the memory cells are SRAM bit-cells.

7. The apparatus of claim 1, wherein the memory cells are part of a register file.

8. The apparatus of claim 7, wherein the register file comprises:
    a bit-line (BL) read port;
    a first local bit-line (LBL) coupled to the BL read port;
    a second LBL; and
    a NAND or a NOR gate coupled to the first and second LBLs such that the first and second LBLs are physically disconnected from one another.

9. The apparatus of claim 8, wherein the register file comprises a split-keeper which is operable to be turned off during precharge, the split-keeper having a first part and a second part, wherein the first part of the split-keeper is coupled to the first LBL and the second part of the split-keeper is coupled to the second LBL.

10. The apparatus of claim 9, wherein the register file comprises a first NAND gate which is controllable by a first pre-charge node, and coupled to the first LBL.

11. The apparatus of claim 10, wherein the register file comprises a second NAND gate which is controllable by a second pre-charge node, and coupled to the second LBL.

12. The apparatus of claim 11, wherein an output of the first NAND gate is to control the first part of the split-keeper, and wherein an output of the second NAND gate is to control the second part of the split-keeper.

13. The apparatus of claim 10, wherein the register file comprises:
    a first pre-charge transistor coupled to the first LBL and to the first pre-charge node; and
    a second pre-charge transistor coupled to the second LBL and to the second pre-charge node.

14. The apparatus of claim 9, wherein the split-keeper includes a stack of devices which is operable to turn on after a delay and after a read operation begins.

15. The apparatus of claim 14, wherein the stack of device comprises p-type devices.

16. A system comprising:
a memory;
a processor coupled to the memory, the memory including an apparatus which includes:
  a first supply node to provide power supply;
  a column of memory cells coupled to the first supply node;
  a diode-connected device having a gate terminal connected to the first supply node, and a source terminal coupled to second supply node; and
  a stack of devices coupled to the first supply node, wherein at least one device in the stack is coupled to the second supply node, and wherein the stack of devices is controllable according to an operation mode; and
a wireless interface for allowing the processor to communicate with another device.

17. The system of claim 16, wherein the memory is an SRAM.

18. The system of claim 16, wherein:
the stack of devices is to be turned on when a memory cell in the column of memory cells is being read from or written to;
the stack of devices is to be turned off when none of the memory cells in the column of memory cells is being read from or written to; and
the stack of devices is to be turned on during a low power mode operation.

* * * * *